United States Patent [19]

Nojiri

[11] Patent Number: 4,640,585
[45] Date of Patent: Feb. 3, 1987

[54] SEMICONDUCTOR THIN FILM LENS
[75] Inventor: Hidetoshi Nojiri, Matsudo, Japan
[73] Assignee: Canon Kabushiki Kaisha, Tokyo, Japan
[21] Appl. No.: 603,757
[22] Filed: Apr. 25, 1984
[30] Foreign Application Priority Data Apr. 28, 1983 [JP] Japan ................................ 58-75832
Apr. 11, 1984 [JP] Japan ................................ 59-73817

[51] Int. Cl.⁴ .............................................. G02B 3/00
[52] U.S. Cl. .............................. 350/413; 350/96.12; 350/96.18
[58] Field of Search ............... 350/96.11, 96.12, 96.13, 350/96.18, 96.20, 163, 164, 409, 413; 357/85, 90

[56] References Cited
U.S. PATENT DOCUMENTS

| 2,596,251 | 5/1952 | Kock | 350/96.18 X |
| 3,427,627 | 2/1969 | Horst | 350/413 X |
| 3,894,789 | 7/1975 | Kobayashi et al. | 350/96.18 |
| 4,025,157 | 5/1977 | Martin | 350/96.18 |
| 4,152,044 | 5/1979 | Liu | 350/96.12 |

FOREIGN PATENT DOCUMENTS 52-69643  6/1977  Japan .................................. 350/413

OTHER PUBLICATIONS

Van Der Ziel, "Phase-Matched Harmonic Generation in a Laminar Structure With . . . ," *Appl. Phys. Lett.*, vol. 26, No. 2, Jan. 1975, pp. 60–61.

Primary Examiner—John Lee
Attorney, Agent, or Firm—Fitzpatrick, Cella, Harper & Scinto

[57] ABSTRACT

A semiconductor thin film lens comprises a laminated member comprising a semiconductor A and a semiconductor B alternately layered, the semiconductors A and B satisfying the following conditions:

$$n_A > n_B, \ E_{gA} < E_{gB},$$

where $E_{gA}$ is the forbidden bandwidth of the semiconductor A, $n_A$ is the refractive index of the semiconductor A, $E_{gB}$ is the forbidden bandwidth of the semiconductor B, and $n_B$ is the refractive index of the semiconductor B. The thicknesses of the layers of the semiconductor A and the semiconductor B, respectively, are sufficiently smaller than the wavelength corresponding to the forbidden band width of the semiconductor A. The laminated member as a whole has a refractive index gradient which creates a lens action.

9 Claims, 9 Drawing Figures

SEMICONDUCTOR THIN FILM LENS

BACKGROUND OF THE INVENTION

1. Field of the Invention

This invention relates to a thin film lens formed of semiconductors, and more particularly to a thin film lens suitable for condensing a laser light emitted from a semiconductor laser or the like.

2. Description of the Prior Art

Generally, the light emitted from a semiconductor laser is an asymmetrical elliptical beam having great angles of expanse of 30°-60° in a direction perpendicular to the joined surface and 4°-10° in a direction parallel to the joined surface. Therefore, where the light beam from a semiconductor laser, for example, is provided directly to a light waveguide or an optical fiber, the coupling efficiency is remarkably reduced. Therefore, use has heretofore been made of a coupling system as shown in FIGS. 1A and 1B of the accompanying drawings. FIG. 1A is a schematic cross-sectional view of the coupling system, and FIG. 1B is a plan view of the coupling system. The asymmetrical beam 4 emitted from a semiconductor laser 1 is made into a symmetrical beam 4' by a minute diameter cylindrical lens 2 and directed into an optical fiber 3. Reference numeral 5 designates a heat sink, and reference numeral 6 denotes a support jig. To obtain sufficient coupling efficiency in such a coupling system, the optic axes of the lens and the optical fiber must be exactly coincident with the light beam.

However, the diameter of the aforementioned minute diameter cylindrical lens is as small as 0.2-0.3 mm and the coupling efficiency is remarkably reduced for any deviation from the optic axis, and this has led to a disadvantage that position adjustment of the lens is very difficult.

Also, generally in a case where a lens is to be incorporated into an optical integrated circuit including a semiconductor laser or the like, adjustment of the optic axis thereof and fixing of the lens is difficult, and this has formed a factor which hampers the integration.

SUMMARY OF THE INVENTION

It is an object of the present invention to provide a semiconductor thin film lens which is compact and simple in position adjustment with respect to an incident light.

It is another object of the present invention to provide a semiconductor thin film lens which can be integrated with a semiconductor element.

The present invention achieves the above objects by a semiconductor thin film lens which comprises a semiconductor A and a semiconductor B alternately layered to thicknesses sufficiently smaller than the wavelength corresponding to the forbidden bandwidth of the semiconductor A, the semiconductors A and B satisfying the following conditions:

$$n_A > n_B, E_{gA} < E_{gB},$$

where $E_{gA}$ is the forbidden bandwidth of the semiconductor A, $n_A$ is the refractive index of the semiconductor A, $E_{gB}$ is the forbidden bandwidth of the semiconductor B, and $n_B$ is the refractive index of the semiconductor B.

The invention will become more fully apparent from the following detailed description thereof taken in conjunction with the accompanying drawings.

DESCRIPTION OF THE PREFERRED EMBODIMENTS

Figure 1A:
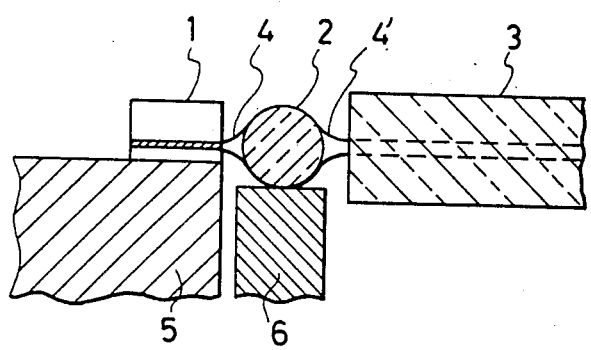
FIGS. 1A and 1B schematically show an optical system using a conventional minute diameter cylindrical lens.
Figure 1B:
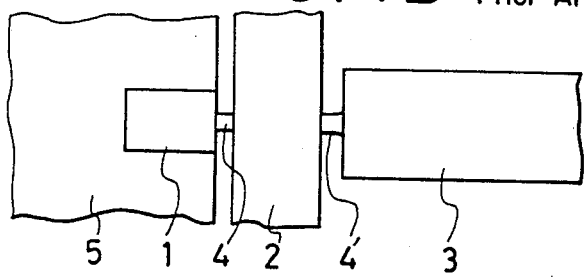
Figures 2A, 2B:
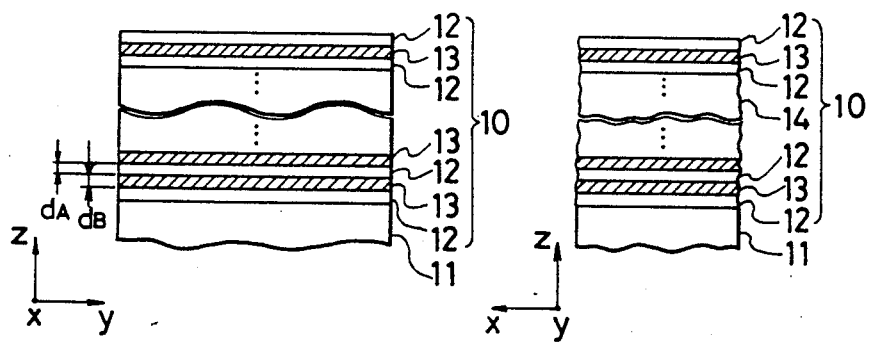
FIGS. 2A and 2B show the construction of a first embodiment of the semiconductor thin film lens of the present invention.

FIGS. 2A and 2B schematically show the construction of a first embodiment of the present invention, FIG. 2A being a side view and FIG. 2B being a front view. A GaAs layer 12 having a thickness of 100 Å is formed on a GaAs substrate 11, and a $Ga_{0.7}Al_{0.3}As$ layer 13 having a thickness of 30 Å is formed thereon. Further, GaAs layers 12 each having the same thickness as that previously mentioned and $Ga_{0.7}Al_{0.3}As$ layers 13 each having the same thickness as that previously mentioned are alternately formed thereon, thus forming a laminated member having a thickness of several to ten μm to ten and several μm as a whole. Also, Si is doped into each of the GaAs layer 12 and the $Ga_{0.7}Al_{0.3}As$ layers 13 in the laminated member while the doping quantity thereof is gradually varied, whereby a semiconductor thin film lens 10 is constructed.

Before the function of the semiconductor thin film lens 10 is described, description will first be made of the behavior of the semiconductor laminated member in a case where doping is not effected. Table 1 below shows the forbidden band width, the refractive index and the thickness of the above-described semiconductor layer.

TABLE 1

|  | GaAs layer | $Ga_{0.7}Al_{0.3}As$ layer |
| --- | --- | --- |
| Refractive index | 3.655 | 3.38 |
| Forbidden bandwidth (eV) | 1.428 | 1.79 |
| Thickness (Å) | 100 | 30 |

If the forbidden bandwidth, the refractive index and the thickness of the GaAs layer 12 are $E_{gA}$, $n_A$ and $d_A$, respectively, and the forbidden bandwidth, the refractive index and the thickness of the $Ga_{0.7}Al_{0.3}As$ layer 13 are $E_{gB}$, $n_B$ and $d_B$, respectively, then the following conditions are satisfied:

$$E_{gA} < E_{gB}, n_A > n_B \tag{1}$$

Also, the thicknesses $d_A$ and $d_B$ of the respective layers have a value of one several tenth to one several hundredth of wavelengths $\lambda_A (=1.24/E_{gA}$, unit μm) and $\lambda_B(=1.24/E_{gB}$, unit μm) corresponding to the forbidden bandwidths.

Thus, the GaAs layers 12 and the Ga$_{0.7}$Al$_{0.3}$As layers 13 layered to respective thicknesses $d_A$ and $d_B$ which are sufficiently thinner than $\lambda_A$ lose their properties of semiconductor and behave approximately like a homogeneous matter in which the forbidden bandwidth $E_g=1.46$-4(eV) and the refractive index $\bar{n}=3.58$. That is, there is established the following relations: $E_{gA}<E_g<E_{gB}$, $n_A>\bar{n}>n_B$ (2)

and a light having energy less than $E_g$ is not absorbed into but transmitted through the laminated member comprising the GaAs layers 12 and the Ga$_{0.7}$Al$_{0.3}$As layers 13. The present embodiment has been constructed by endowing such a laminated member with a refractive index gradient or distribution by doping so that a lens action is created for the transmitted light.

Figure 3A:
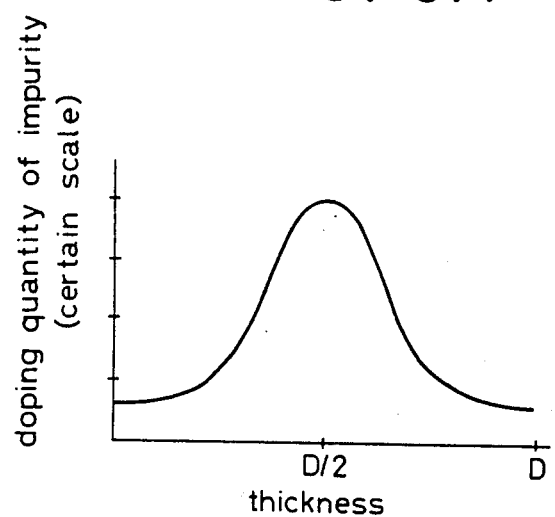
FIGS. 3A and 3B show the doping quantity of impurity and the index gradient in the first embodiment.
Figure 3B:
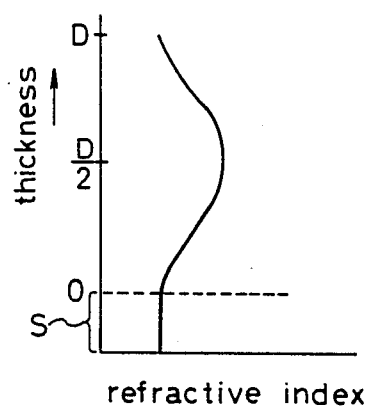

FIG. 3A shows the distribution of the doping quantity of an impurity Si doped into the GaAs layers 12 and the Ga$_{0.7}$Al$_{0.3}$As layers 13 in the z-direction of of the embodiment shown in FIG. 2. If the doping quantity of the impurity is gradually varied in the central portion and the marginal portion of the laminated member as shown in FIG. 3A, the refractive index thereof becomes higher in the central portion thereof and lower in the marginal portion thereof, namely, on the substrate and upper layer sides, as shown in FIG. 3B. Accordingly, as seen in an ordinary light converging conductor, a light of energy less than $E_g$ which travels through the semiconductor thin film lens 10 in the y-direction in FIGS. 2A and 2B is converged so as to depict a sine curve in the z-direction.

Specifically, if, for example, the doping quantity of Si in the GaAs layer in the central portion of the semiconductor thin film lens 10 is $6.7\times10^{18}$cm$^{-3}$ and the doping quantity in the marginal portion thereof is $5.9\times10^{17}$cm$^{-3}$, the refractive indices in the central portion and the marginal portion become 3.73 and 3.68, respectively, for a light of energy of 1.5 eV and thus, by gradually varying the doping quantity between the central portion and the marginal portion, there can be obtained a sufficient lens action. The thicknesses shown in FIGS. 2A and 2B are indicated in an arbitrary measure wherein the thickness of the semiconductor thin film lens 10 in the z-direction is D, and S in FIG. 2B designates the substrate portion.

However, the relation between the amount of dopant and the refractive index is varied by the wavelength of the light used, and even where Si is used, for a light of energy of 1.4 eV, as the amount of dopant is smaller, the refractive index becomes higher. Such a relation is widely known as a characteristic of semiconductor elements and it is necessary that the distribution of the amount of dopant be set in accordance with the specification of the lens made and the wavelength used. The dopant is not limited to Si which is an n-type impurity, but may also be other n-type impurities or Be which is a p-type impurity.

The GaAs layers 12 and the Ga$_{0.7}$Al$_{0.3}$As layers 13 in the above-described embodiment may be formed by growing thin film crystals as in a case where a semiconductor element is manufactured by the use of molecular beam epitaxy (MBE) or vapor phase epitaxy (VPE). In this case, doping can be accomplished by mixing an impurity with the atmosphere, and depending on in which portion (the central portion or the marginal portion) of the semiconductor thin film lens the layers of crystals are growing, the growth condition (for example, in the case of MBE, the temperature of cells which produce the molecular beam of Si) is varied to thereby obtain the desired doping quantity distribution as shown in FIG. 2A.

Figure 4:
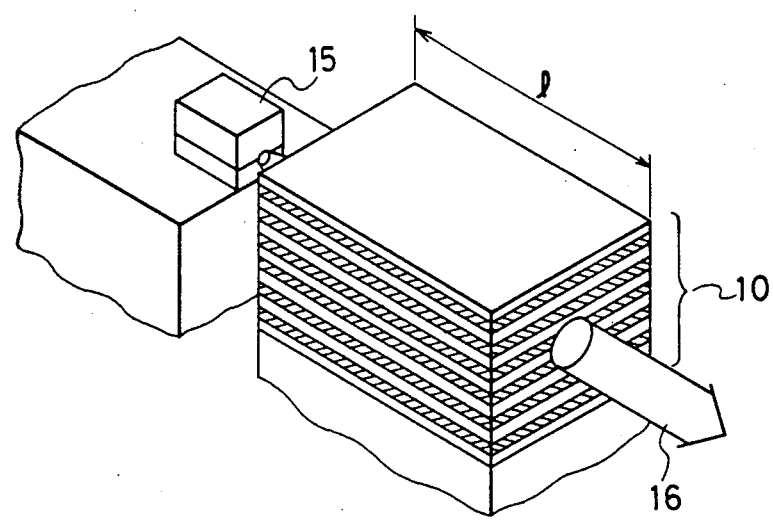
FIG. 4 is a schematic view illustrating a case where the first embodiment is used for the beam shaping of the laser light from a semiconductor laser.

The semiconductor thin film lens according to the above-described embodiment can be used in the manner as shown, for example, in FIG. 4. The asymmetrical beam emitted from a semiconductor laser 15 enters the semiconductor thin film lens 10 and is subjected to a converging action only in the z-direction. Accordingly, by suitably choosing the lens length l so that the diverging angle of the beam in the z-direction becomes equal to the diverging angle of the beam in the x-direction, the asymmetrical beam emitted from the semiconductor laser can be shaped and taken out as a circular symmetrical beam 16. The light thus passed through the semiconductor thin film lens can be optically coupled to an optical fiber or a thin film waveguide. The semiconductor thin film lens according to the present embodiment is made on a substrate by the use of conventional semiconductor element manufacturing techniques and therefore can be formed compactly and precisely, and adjustment of its optic axis can be accomplished simply by adjusting the positional relation between the substrate and the semiconductor laser or the like.

In the semiconductor thin film lens 10 according to the present embodiment, gratings 14 can be provided at the opposite ends of the lens as shown in FIG. 2B to endow the lens with a lens action also in the x-direction, but where the lens action only in the z-direction suffices, the gratings 14 are not always necessary.

Figure 5:
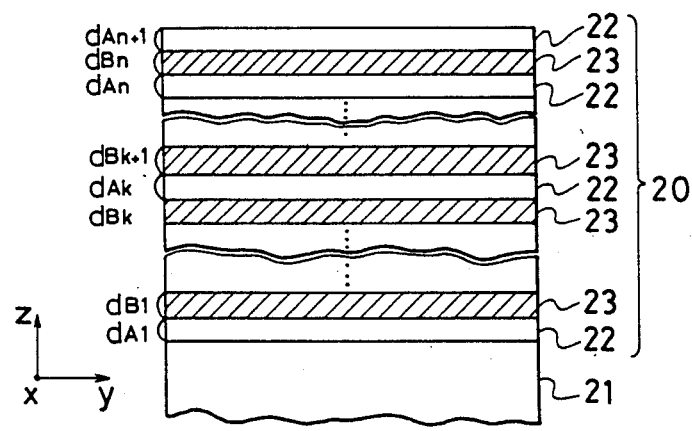
FIG. 5 shows the construction of a second embodiment of the semiconductor thin film lens of the present invention.

FIG. 5 is a schematic side view showing the construction of a second embodiment of the present invention. In this embodiment, basically similar to the first embodiment, GaAs layers 22 and Ga$_{0.7}$Al$_{0.3}$As layers 23 are alternately layered on GaAs substrate 21 to thereby form a thin film lens 20 having a thickness of several to ten μm and several μm as a whole. In the present embodiment, however, no impurity is doped into the semiconductor layers and a refractive index gradient having a lens action is obtained by gradually varying the thickness of each semiconductor layer. Again in the present embodiment, each semiconductor layer satisfies formula (1) and the thicknesses $d_{A1}$, $d_{A2}$, ... $d_{An+1}$, $dB1$, $dB2$, ... $d_{Bn}$ of the respective layers have a value of one several tenth to one several hundredth of $\lambda_A$ or $\lambda_b$. Accordingly, as in the first embodiment, the thin film lens according to the present embodiment transmits therethrough light having energy less than a predetermined level, but the effective refractive index is varied in the z-direction by a variation in thickness of the semiconductor layers, and the thin film lens as a whole behaves as a substance having a certain refractive index gradient.

Specifically, by gradually varying the thicknesses $d_{A1}=25$ Å and $d_{B1}=28$ Å of the semiconductor layers near the substrate and the thicknesses $d_{Ak}=53$ Å and $d_{Bk}73$ Å of the semiconductor layers in the central portion, an effective refractive index 3.22 is obtained near the substrate and an effective refractive index 3.48 is obtained near the central portion, for a light of energy 1.5 eV. Likewise, by gradually varying the thicknesses $d_{An+1}=25$ Å and $d_{Bn}=28$ Å of the semiconductor layers in the upper end portion of the thin film lens, an effective refractive index 3.22 is obtained near the upper end portion. In this manner, the semiconductor thin film lens according to the present embodiment, like the first embodiment, has the index gradient as shown in FIG. 3B in the z-direction, and the light travelling through this thin film lens in the y-direction is converged in the z-direction.

The semiconductor thin film lens according to this embodiment, like the first embodiment, is formed by growing semiconductor layers into thin film crystals on the substrate by the use of MBE or VPE. The thickness of each semiconductor layer, for example, in the case of MBE, can be accurately controlled on the order one angstrom by adjustment of the growth time.

The present embodiment also can be used in combination with a semiconductor laser, as shown in FIG. 4. In the present embodiment, there has been shown an example in which doping is not effected, but by using the doping described in connection with the first embodiment in combination with the variation in refractive index by adjustment of the film thickness, the index gradient can be made steep and thus, a lens having a short lens length l can be obtained.

Figure 6:
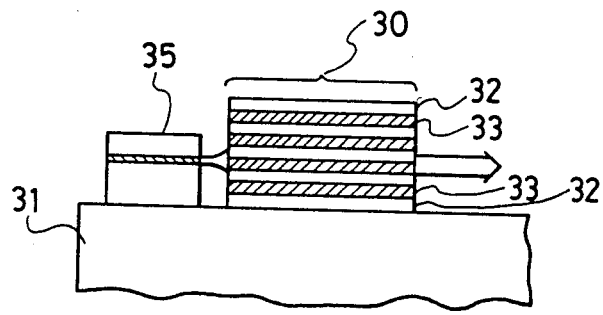
FIG. 6 is a schematic view showing a case where the semiconductor thin film lens of the present invention is formed on the same substrate as a semiconductor laser.

The semiconductor thin film lens of the present invention as shown in the first and second embodiments can be constructed monolithically with a semiconductor laser. For example, as shown in FIG. 6, an ordinary GaAs-GaAlAs semiconductor laser 35 is made on a GaAs substrate 31 by the use of the ordinary semiconductor manufacturing technique, and this semiconductor laser is masked, whereafter GaAs layers 32 and $Ga_{0.7}Al_{0.3}AS$ layers 33 are alternately layered on the same substrate, and then the mask is removed to thereby form a semiconductor thin film lens 30. The semiconductor laser 35 and the semiconductor thin film lens 30 are formed integrally with each other and therefore, mutual positional adjustment thereof is unnecessary and a compact light source system which emits a symmetrical beam is constructed. Further, a light waveguide or the like may be hybridly formed on the same substrate, whereby it is applicable to an integrated optical compound element or the like.

In the above-described embodiments, GaAs and GaAlAs have been used as the semiconductor, but the present invention can also be constructed by the use of plural conglomerates of other III-V group semiconductors or II-VI group semiconductors or the like.

I claim:

1. A semiconductor thin film lens comprising a laminated member comprising a semiconductor A and a semiconductor B alternately layered, said semiconductors A and B satisfying the following conditions:

$$n_A > n_B, \ E_{gA} < E_{gB},$$

where $E_{gA}$ is the forbidden bandwidth of said semiconductor A, $n_A$ is the refractive index of said semiconductor A, $E_{gB}$ is the forbidden bandwidth of said semiconductor B, and $n_B$ is the refractive index of said semiconductor B, the thicknesses of the layers of said semiconductor A and said semiconductor B, respectively, having values of several tenths to several one hundredths of wavelengths corresponding to the forbidden bandwidths of said semiconductor A and said semiconductor B, different amounts of impurity being doped into the respective layers, whereby said laminated member as a whole has refractive index gradient which creates a lens action on a light beam entering the lens from the exterior thereof.

2. A semiconductor thin film lens according to claim 1, wherein said semiconductor A and said semiconductor B are GaAs and $Ga_{0.7}Al_{0.3}As$, respectively.

3. A semiconductor thin film lens according to claim 1, wherein said impurity is Si.

4. A semiconductor thin film lens according to claim 1, wherein said semiconductor thin film lens is formed on the same substrate as a semiconductor laser monolithically therewith, and is adapted to allow a laser light emitted from said semiconductor laser to enter said semiconductor thin film lens.

5. A semiconductor thin film lens comprising a laminated member comprising a semiconductor A and a semiconductor B alternately layered, said semiconductor A and B satisfying the following conditions:

$$n_A > n_B, \ E_{gA} < E_{gB},$$

where $E_{gA}$ is the forbidden bandwidth of said semiconductor A, $n_A$ is the refractive index of said semiconductor A, $E_{gB}$ is the forbidden bandwidth of said semiconductor B, and $n_B$ is the refractive index of said semiconductor B, the thicknesses of the layers of said semiconductor A and said semiconductor B, respectively, having values of several tenths to several one-hundredths of wavelengths corresponding to the forbidden bandwidths of said semiconductor A and said semiconductor B, said layers of said semiconductor A and said layers of said semiconductor B being formed to different thicknesses, whereby said laminated member has a refractive index gradient which creates a lens actions on a light beam entering the lens from the exterior thereof.

6. A semiconductor thin film lens according to claim 5, wherein the thickness of each layer of said semiconductor A and said semiconductor B is greater in the central portion of the laminated member and gradually smaller toward the marginal portion of the laminated member.

7. A semiconductor thin film lens according to claim 6, wherein an impurity is doped into the layers of said semiconductor A and said semiconductor B and the doping quantity thereof is greater in the central portion of the semiconductor thin film lens with respect to a direction of the lamination and gradually decreases toward the marginal portion of the semiconductor thin film lens.

8. A semiconductor thin film lens according to claim 5, wherein said semiconductor A and said semiconductor B are GaAs and $Ga_{0.7}Al_{0.3}As$, respectively.

9. A semiconductor thin film lens according to claim 5, wherein said semiconductor thin film lens is formed on the same substrate as a semiconductor laser monolithically therewith, and is adapted to allow a laser light emitted from said semiconductor laser to enter said semiconductor thin film lens.

* * * * *

UNITED STATES PATENT AND TRADEMARK OFFICE
CERTIFICATE OF CORRECTION

PATENT NO. : 4,640,585
DATED : February 3, 1987
INVENTOR(S) : HIDETOSHI NOJIRI

It is certified that error appears in the above-identified patent and that said Letters Patent is hereby corrected as shown below:

AT [57] IN THE ABSTRACT

Line 15, "band width" should read --bandwidth--.

COLUMN 2

Line 37, "to ten" should be deleted.

COLUMN 3

Line 21, "of of" should read --of--.
Lines 44-45, "measure" should read --manner--.

COLUMN 4

Line 45, "dB1, dB2," should read --$d_{B1}$, $d_{B2}$--.
Line 47, "$\lambda b$" should read --$\lambda_B$--.
Line 59, "$d_{Bk}$73A" should read --$d_{Bk}$=73 Å--.

UNITED STATES PATENT AND TRADEMARK OFFICE
CERTIFICATE OF CORRECTION

PATENT NO. : 4,640,585

DATED : February 3, 1987

INVENTOR(S) : Hidetoshi Nojiri

It is certified that error appears in the above-identified patent and that said Letters Patent is hereby corrected as shown below:

COLUMN 5

Line 10, "one" should read -- of one --.

Signed and Sealed this

Twenty-eighth Day of April, 1987

*Attest:*

DONALD J. QUIGG

*Attesting Officer*   *Commissioner of Patents and Trademarks*